United States Patent
Kim et al.

(10) Patent No.: US 12,195,874 B2
(45) Date of Patent: Jan. 14, 2025

(54) FABRICATION OF PBSE NANOSTRUCTURES BY EMPLOYING CHEMICAL BATH DEPOSITION (CBD) FOR PHOTONICS APPLICATIONS

(71) Applicant: Illinois Tool Works Inc., Glenview, IL (US)

(72) Inventors: Richard S. Kim, Camarillo, CA (US); Jeung Hun Park, Camarillo, CA (US)

(73) Assignee: Illinois Tool Works Inc., Glenview, IL (US)

( * ) Notice: Subject to any disclaimer, the term of this patent is extended or adjusted under 35 U.S.C. 154(b) by 143 days.

(21) Appl. No.: 17/988,326

(22) Filed: Nov. 16, 2022

(65) Prior Publication Data
US 2023/0160099 A1    May 25, 2023

Related U.S. Application Data

(60) Provisional application No. 63/282,389, filed on Nov. 23, 2021.

(51) Int. Cl.
| | | |
|---|---|---|
| *C30B 19/10* | (2006.01) | |
| *B82Y 15/00* | (2011.01) | |
| *B82Y 30/00* | (2011.01) | |
| *C30B 29/46* | (2006.01) | |
| *C30B 31/06* | (2006.01) | |
| *C30B 33/02* | (2006.01) | |
| *C30B 33/10* | (2006.01) | |

(52) U.S. Cl.
CPC ............. *C30B 19/10* (2013.01); *B82Y 15/00* (2013.01); *B82Y 30/00* (2013.01); *C30B 29/46* (2013.01); *C30B 31/06* (2013.01); *C30B 33/02* (2013.01); *C30B 33/10* (2013.01)

(58) Field of Classification Search
CPC ......... C01B 19/007; C30B 1/02; C30B 19/10; C30B 29/46; C30B 31/06; C30B 33/02; C30B 33/10
See application file for complete search history.

(56) References Cited

U.S. PATENT DOCUMENTS

2014/0252529 A1    9/2014    Shi
2022/0359226 A1*   11/2022   Harrison ............. H01L 31/0324

OTHER PUBLICATIONS

Jang et al., "Properties of chemical bath deposited and sensitized PbSe thin films for IR detection," Semicond. Sci. Technol. 34, p. 1-8 (Year: 2019).*

(Continued)

*Primary Examiner* — Matthew J Song
(74) *Attorney, Agent, or Firm* — McAndrews, Held & Malloy, Ltd.

(57) ABSTRACT

Methods and systems are provided for a homogenous, single crystal, electrically conductive, and narrow bandgap PbSe nanostructure is synthesized using a chemical bath deposition on, for example, quartz substrates, and includes a tunable iodine doping process to select the size and/or shape of the nanostructures. The single crystalline PbSe nanostructure can be exposed following an isolation process (e.g., etching process), and the concentration and/or distribution of iodine across multiple PbSe nanostructures (e.g., on a quartz substrate) can be adjusted during post processing steps, including heat treatments.

19 Claims, 8 Drawing Sheets

(56) References Cited

OTHER PUBLICATIONS

Qiu et al., "Large-scale self-assembled epitaxial growth of highly-ordered three-dimensional micro/nano single-crystalline PbSe pyramid arrays by selective chemical bath deposition," Mater. Res. Express 2, p. 1-10 (Year: 2015).*
Int'l Search Report and Written Opinion Appln No. PCT/US2022/050328 mailed Mar. 7, 2023.
Kim Sung-Gu et al: "Nanoparticle and Laminar Structured Lead Selenide Photoconductive Thin Film", Journal of Nanoscience and Nanotechnology, vol. 19, No. 4, Apr. 1, 2019 (Apr. 1, 2019), pp. 2334-2338, XP093026852, Retrieved from the Internet: URL:https://doi.org/10.1166/jnn.2019.16113.
Chen Pengyu et al: "High-performance silicon-based PbSe-CQDs infrared photodetector", Journal of Materials Science: Materials in Electronics, Chapman and Hall, London, GB, vol. 32, No. 7, Mar. 10, 2021 (Mar. 10, 2021), pp. 9452-9462, XP037428969, ISSN: 0957-4522, DOI: 10.1007/S10854-021-05609-Y [retrieved on Mar. 10, 2021].
So Hye-Mi et al: "Oxygen aided photoresponse enhancement of air-stable PbSe quantum dot based photoconductors", Optical Materials Express, vol. 7, No. 8, Jul. 18, 2017 (Jul. 18, 2017), p. 2905, XP055794609, DOI: 10.1364/OME.7.002905.

* cited by examiner

FABRICATION OF PBSE NANOSTRUCTURES BY EMPLOYING CHEMICAL BATH DEPOSITION (CBD) FOR PHOTONICS APPLICATIONS

RELATED APPLICATIONS

The present application claims the benefit of, and priority to, U.S. Provisional Application No. 63/282,389, filed Nov. 23, 2021, entitled "Fabrication Of PbSe Nanostructures By Employing Chemical Bath Deposition (CBD) For Photonics Applications." The complete subject matter and contents of App. Ser. No. 63/282,389 are incorporated herein by reference in their entireties.

BACKGROUND

Numerous applications employ photosensitive materials as detectors. However, conventional technologies can be expensive and complex to produce, and may have a narrow absorption range. Photosensitive materials with increased sensitivity, produced by less expensive and less complex processes, therefore desirable.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method is provided for a homogenous, single crystal, electrically conductive, and narrow bandgap PbSe nanostructure is synthesized using a chemical bath deposition on, for example, quartz substrates, and includes a tunable iodine doping process to select the size and/or shape of the nanostructures. The single crystalline PbSe nanostructure can be exposed following an etching process, and the concentration and/or distribution of iodine across multiple PbSe nanostructures (e.g., on a quartz substrate) can be adjusted during post processing steps, including heat treatments.

These and various other advantages, aspects and novel features of the present disclosure, as well as details of an illustrated embodiment thereof, will be more fully understood from the following description and drawings.

BRIEF DESCRIPTION OF THE DRAWINGS

The figures are not necessarily to scale. Where appropriate, similar or identical reference numbers are used to refer to similar or identical components.

DETAILED DESCRIPTION

Figure 1:
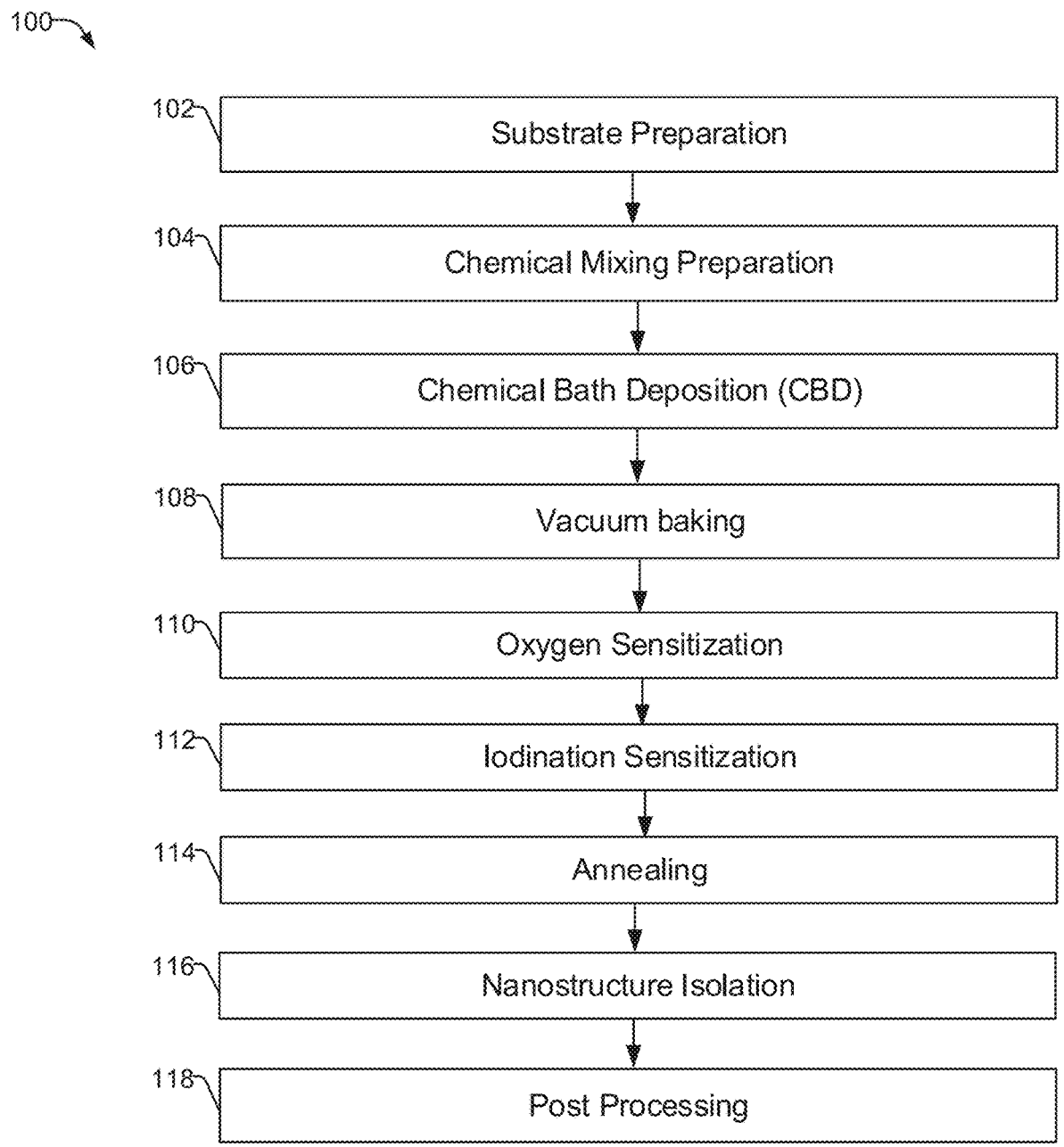
FIG. 1 illustrates an example method to process single crystalline Lead Selenide (PbSe) nanostructures, in accordance with an example embodiment of the disclosure

In some examples, the PbSe nanostructure is created by a method to process single crystalline PbSe nanostructures consisting of one or more of substrate preparation, chemical preparation and mixing with solvent, chemical deposition (e.g., via chemical bath deposition), vacuum baking, thin film oxidation, thin film iodination, annealing, nanostructure isolation (e.g., chemical and/or electrochemical etching to remove oxide and a separation process), and/or post processing.

In this disclosure, a homogenous, single crystal, electrically conductive, and narrow bandgap PbSe nanostructure is synthesized using a chemical bath deposition on, for example, quartz substrates, and includes a tunable iodine doping process to select the size and/or shape of the nanostructures. The single crystalline PbSe nanostructure can be exposed following a nanostructure isolation process (e.g., an etching process), and the concentration and/or distribution of iodine across multiple PbSe nanostructures (e.g., on a quartz substrate) can be adjusted during post processing steps, including heat treatments.

In disclosed examples, iodine-doped PbSe nanostructures are applied to thin film samples, which are synthesized using chemical bath deposition and techniques that include oxygen sensitization, iodination, and one or more post processes (e.g., heat treatments and/or baking). Disclosed PbSe nanostructures, including methods of producing such nanostructures, thin films comprising the nanostructures, and applications employing such nanostructures, exhibit a correlation between the size, shape, orientation, and/or layer thickness of PbSe nanostructures and sensitivity of the sensor itself. For example, the iodine-doped PbSe single crystallized nanostructures are created after a series of surface treatments, include one or more of chemical bath deposition, oxygen sensitization, iodine sensitization, post annealing, and/or an etching processes. The resulting single crystalline PbSe, presented as a thin film on a quartz substrate, for example, exhibits an elevated and distributed iodine concentration to provide enhanced sensitivity and broader absorption characteristics.

As used herein, the term "nano" refers to the nanometer (nm) scale of measurement, and may be used to describe structures, particles, distances, wavelengths, etc., measured in a nano-scale.

As utilized herein, "and/or" means any one or more of the items in the list joined by "and/or". For example, "x and/or y" means any element of the three-element set $\{(x), (y), (x, y)\}$. Similarly, "x, y, and/or z" means any element of the seven-element set $\{(x), (y), (z), (x, y), (x, z), (y, z), (x, y, z)\}$. As utilized herein, the term "module" refers to functions that can be implemented in hardware, software, firmware, or any combination of one or more thereof. As utilized herein, the terms "example" or "exemplary" mean serving as a non-limiting example, instance, or illustration.

In disclosed examples, a method of forming a single crystalline lead selenide (PbSe) nanostructure is provided. The method includes preparing a substrate; preparing chemical lead and selenium precursors; depositing the precursors to the substrate via a chemical bath deposition (CBD)

process, resulting in a thin film comprising a PbSe alloy; vacuum baking the thin film at a temperature above 100° C. to get rid of residual solvent; expose the thin film to an oxygenated gas to induce re-crystallization and produce an oxide passivation layer; doping the thin film with a vapor comprising a predetermined concentration of iodine for a predetermined time period; applying nanostructure isolation techniques using a chemical etchant (and/or an electrochemical etching process) to the thin film to uncover a single crystalline PbSe nanostructure underlying the oxide passivation layer and polycrystalline PbSe; and post processing the thin film with the uncovered single crystalline PbSe to redistribute iodine to the PbSe nanostructure.

In some examples, the depositing yields two layers PbSe crystalline layer including a first, exposed layer comprising a polycrystalline PbSe oxide form substantially free of iodine; and a second, underlying layer comprising the single crystalline PbSe nanostructures comprising iodine, wherein an amount of iodine in the single crystalline PbSe is controlled by one or more of a time or a temperature during the doping.

In examples, the depositing includes depositing the precursors for a first time to create the first layer during the CBD process; and depositing the precursors and a carrier solution having a predetermined amount of iodine for a second time to create the second layer during the CBD process.

In some examples, the method further includes varying a time for the deposition during the first or second time, the change in time corresponding to a change in a thickness or morphology of the single crystalline PbSe thin film.

In some examples, the method further includes annealing prior to etching.

In some examples, the first time or the second time is about 30 minutes.

In some examples, the first time or the second time can be varied depending on specification required.

In some examples, the oxygenated gas comprises a mixture of oxygen and nitrogen.

In some examples, the method further includes adjusting the threshold temperature to control of the crystallization of PbSe nanostructure, the threshold temperature corresponds to a size or a shape of the PbSe nanostructure.

In some examples, the PbSe nanostructure comprises one or more of a PbSe nanoprisms, a PbSe nanoplate, a PbSe nanoribbon, or a PbSe nanodisk.

In some examples, the PbSe nanostructure are formed underneath the oxide layer in a variety of different sizes that can be controlled upon fabrication parameters.

In some examples, the predetermined temperature corresponds to about 420° C., resulting in a generally rectangular shape of the nanostructures.

In some examples, substrate comprises a quartz substrate with one or more rough surfaces.

In some examples, the doping with iodine further comprises introducing an iodine vapor into the furnace using nitrogen gas as a carrier.

In some examples, the method further includes post processes by adjusting one of a temperature or a time of the post baking to control a size of the PbSe nanostructures and re-distribution of iodine concentration.

In some examples, the method further includes controlling a rate, time, or temperature of a cooling process to control the shape of the PbSe nanostructures.

In some examples, the method further includes one or more additional annealing procedures including at a predetermined time or temperature to evenly or homogeneously distribute the dopants throughout PbSe matrix.

In some examples, the etching of the polycrystalline PbSe material employs a hydrogen fluoride (HF) solution or NaOH:IPA:DI water.

In some examples, the polycrystalline crystal growth can occur by one of two general deposition mechanisms: ion-by-ion growth, or hydroxide cluster growth.

In some disclosed examples, a photoconductive thin film includes a substrate; and a plurality of single crystalline lead selenide (PbSe) nanoparticles arranged on the substrate, the nanoparticles containing a threshold amount of iodine dopant.

In some examples, the thin film has an electrical property variable by photo or thermal excitation caused by electromagnetic radiation impinging on the thin film.

In some examples, the thin film has a circuit in electrical communication with the thin film.

In some examples, the circuit is configured to measure a change in the electrical property of the thin film in response to photo or thermal excitation caused by the electromagnetic radiation impinging on the thin film.

In some examples, the electromagnetic radiation includes infrared radiation.

In this disclosure, a colloidal synthesis Lead Selenium (PbSe) nanostructures (e.g., nanoprisms, nanodisks, nanorods, etc.) of nano-level thickness and flat is created via a chemical bath deposition process. Also disclosed are methods for preparing photo-sensitive PbSe nanostructures for detection of electromagnetic energy (e.g., infrared and/or mid-infrared (mid-IR) wavelengths).

In disclosed examples, PbSe nanoparticles produced by the disclosed methods can be employed in photosensitive thin films for use as collectors and/or detectors, providing a low cost, nano-sized, single crystalline thin film for use in a variety of applications (e.g., infrared detectors, direct sensors, process control, gas analysis, defense, and/or temperature control). The disclosed PbSe nanoparticles can be employed in other applications, products, and/or use cases (e.g., beyond detection), including in the manufacture of solar cells, light emitting diodes, and/or lasers, as a non-limiting list of examples.

PbSe is a polar semiconductor showing presenting both ionic and covalent chemical bonding, with electrons shared unequally by the nuclei forming these bonds. However, the covalent bonding is predominant in a resulting PbSe crystal. Crystalline PbSe has a face-centered cubic lattice structure, which may have a lattice constant of about 6.12 Å (but could be smaller or greater, depending on desired characteristics). In some examples, the lattice structure may have a direct energy bandgap of about 0.27 eV for bulk material at room temperature, and may possess an intrinsic carrier density of $3 \times 10^{16}$ cm$^{-3}$ (although smaller or greater bandgaps and/or carrier density may be presented, depending on desired characteristics). Due to this narrow bandgap, the structure is sensitive to radiation in the infrared (IR) spectrum. For this reason, at least in part, some Lead Chalcogenides have been employed in a wide variety of applications, including IR sensors, photoresistors, photodiodes, IR lasers, and/or thermoelectric generators. PbSe, for example, offers detection at longer wavelengths in the IR spectrum, ranging from about 4 microns to about 6 microns.

In an example of a single junction solar cell, photons with incoming energy greater than the bandgap of the impacted material is absorbed. However, the excess energy of the photon is lost as heat via thermal relaxation. In order to reduce the energy loss due to thermal relaxation, and thereby increase conversion efficiency, multi-junction solar cells can be integrated by employing different semiconductor materials of varying bandgap energies. Thus, high energy photons can be harvested with greater efficiency in multi-junction solar cells.

However, composition and manufacture of multi-junction semiconductors increases the overall cost of the device, due to increased material use and production complexity. On the other hand, PbSe has a narrow bad gap that allows optical absorption of a greater range of the solar spectrum; most notably in the low-infrared region, where some semiconductor photovoltaic cells cannot absorb. Moreover, disclosed production of a PbSe nanostructure and corresponding thin film is significantly less expensive than conventional semiconducting materials used in photovoltaic cells.

Additionally, PbSe is a direct bandgap semiconductor that is capable of absorbing solar radiation in a material or layer with a thickness of as few as several microns; significantly thinner than conventional solar cells, even those with a more narrow optical absorption range. Moreover, advantageously the disclosed PbSe nanostructure is relatively simple to manufacture in a large area at lower temperatures (e.g., in comparison to conventional semiconducting materials) by low cost fabrication techniques, such as chemical bath deposition.

In this disclosure, polycrystalline PbSe thin films are produced, which is a mixture of nanoparticles (e.g., including nanostructures, such as nanoprisms and/or nanodisks). Such thin films can be used to increase energy absorption from a greater range of the electromagnetic spectrum (e.g., the solar spectrum), while reducing the cost associated with manufacturing and/or maintenance of other semiconductor materials used for solar cell products.

In addition, by employing one or more etching techniques and/or an alignment technique for the nanoparticles, individual particles with low cost for particular detectors and/or solar cells can be produced. In some examples, carrier multiplication and/or quantum size effects are evident in the PbSe nanocrystals. For example, carrier multiplication is a process in which multiple excitons are generated from a single incident photon. For instance, a single incident photon generating up to seven excitons has been observed in PbSe quantum dots. In this disclosure, PbSe nanostructures are provided which can effectively generate and separate these excitons and then contribute to an increase in the conversion efficiency of a solar cell, and/or sensitivity of a detector. In some examples, the band gap of the PbSe increases with a decrease in size of the nanostructure; thus the effect of the quantum confinement allows for tuning of the bandgap in PbSe quantum dots, aiding in the targeted absorption of one or more specific regions of the electromagnetic spectrum.

In an example gas sensor application, the disclosed PbSe nanostructures can be employed in a sensor for Carbon Dioxide ($CO_2$) or Ammonia ($NH_3$) measurement, which is a part of essential environmental applications for monitoring air pollution. Since the PbSe nanostructure (e.g., nanoprism) has a single crystalline structure and a small size, a sensor employing the PbSe nanoprisms may be directly integrated into a small device, such as a smartphone or other device, to monitor air and/or environmental pollution in real-time indoors and outdoors.

Currently, bulky and large polycrystalline PbSe thin films are employed in some detection systems, such as non-dispersive infrared spectroscopy. For example, commercially available thin film detectors have detection limits of about 50 ppm for $CO_2$ concentrations ranging between 0 and 4000 ppm.

Advantageously, the disclosed sensor provides a higher degree of sensitivity, and thus detectivity, as well as cost effectiveness. For example, an air pollution monitoring system employing the PbSe nanostructures can be miniaturized for integration with a variety of devices, including smartphones, personal medical devices, tablets, and/or wearable consumer products, as a list of non-limiting examples.
Nanostructure Isolation Via Ultra-Sonification and Centrifugation, Size Separation/Manipulation Via DEP Process Nanocrystals or nanostructures are typically isolated from their growth and preparation medium by the addition of polar solvents. Mechanically exfoliated lead chalcogenide nanostructures from the substrate are carefully transferred to a polar solvent container. Sedimentation by ultra-sonification and centrifugation in the solvent are used to collect the nanostructures. However, other techniques may be employed to separate monodisperse nanostructures, such as Dieletrophoresis (DEP). This technique is based on the movement of dielectric or polarizable nanostructures in an inhomogeneous electrical field due to the interaction of the nanostructure's dipole and spatial gradients of the electrical field. Since lead chalcogenides have diverse dielectric properties, DEP can be used to manipulate, transport, separate, and sort different types of lead chalcogenides nanocrystals/ nanostructures. DEP chips consist of electrodes, typically a microarray that are separated by a gap that forms the microfluidic channel. Lead chalcogenide nanostructures to be separated are introduced, and the appropriate electric field is applied to separate the targeted nanostructures by their size and shape. A sensor-based DEP device can be employed to monitor the separation process of captured nanostructure enables simultaneous detection and concentration change in nanostructure-contained solution. The interdigitated two electrode devices are designed to perform dielectric capture of nanostructure and to measure the changes in conductivity (e.g., impedance) of the medium.

In some disclosed examples, as illustrated in FIG. 1, a method 100 is provided to process single crystalline PbSe nanostructures (e.g., nanoprisms, etc.) consisting of one or more of substrate preparation 102, chemical preparation and mixing with solvent 104, chemical deposition (e.g., via chemical bath deposition) 106, vacuum baking 108, thin film oxidation (e.g., oxygen sensitization) 110, thin film iodination (e.g., iodine sensitization) 112, annealing 114, nanostructure isolation (e.g., chemical and/or electrochemical etching to remove oxide) 116, and/or post processing 118. As provided herein, the process can proceed as listed, can proceed with one or more of the listed actions being optional, and/or arranged differently.

In some examples, a Quartz substrate is subject to pre-cleaning, which may include additional or optional plasma cleaning, and/or a surface treatment to roughen one or more surfaces of the substrate in the step of substrate preparation. In step 4, the vacuum bake is done at a predetermined temperature and/or temperature range (e.g., about 105° C.) for a predetermined amount of time (e.g., about 16 hours), and the oxidation process is carried out at a predetermined temperature greater than the initial vacuum bake temperature (e.g., about 420° C. In some examples, iodine sensitization can be carried out by a quartz tube furnace with a mixed gas constituted of a carrier solution (e.g., nitrogen) and an iodine vapor at a predetermined temperature (e.g., 450° C.). Chemical etching is carried out in a mixed solution of hydrogen fluoride (HF) and deionized (DI) water (e.g., NaOH:IPA:DI), which may have a solution concentration of HF of 50:1 (per volume ratio) and/or DI water of 1:25:50 (per volume ratio). As a result of the disclosed methods, the PbSe nanostructures, including nanoprisms, are formed underneath the oxide PbSe phases with a variety of different sizes.

By employing the inexpensive, the overall costs for making PbSe nanostructures will be reduced. These and other disclosed methods and resulting PbSe nanostructure products provide advantages over other techniques, as it allows for production of large amounts of single crystalline nanoprisms with a change of the iodine doping levels in a low cost and low-temperature fabrication technique employing CBD methods.

PbSe Growth Mechanism

In order to produce PbSe nanostructures, including nanoprisms, nanodisks and/or nanorods, the polycrystalline and/or amorphous PbSe layer or thin film can be formed first. The rate of PbSe film growth is largely dependent on the rate of release of $Pb^{2+}$ ions from the complex state, and the decomposition of Lead Acetate Trihydrate $(C_4H_6O_4Pb \cdot 3H_2O)$ and Selenourea $(CH_4N_2Se)$. PbSe is formed when the ionic product of $Pb^{2+}$ and $Se^{2-}$ ions exceeds the solution solubility product of PbSe (e.g., at about $10^{-38}$ at 300K). Therefore, the concentration of lead and selenium ions is controlled during the film growth.

In the deposition of lead chalcogenide, in general, with Lead Acetate Trihydrate acting as the lead precursor, is complexed to control the release of the metal cation $Pb^{2+}$-ions as well as to prevent the precipitation of $Pb(OH)_2$. In the case of PbSe, the hydrolysis of the chalcogenide precursor, Selenourea $(CH_4N_2Se)$, will provide the anions $Se^{2-}$-ions. A lead chalcogenide will precipitate provided that the ionic product is greater than the solubility product (e.g., $K_{sp} \sim 10^{-38}$ for PbSe at 300K). Even though a large amount of precipitation is expected during the CBD process, a significant amount is not expected to adhere to the substrate. Therefore, the polycrystalline crystal growth can occur by one of two general deposition mechanisms: ion-by-ion growth, or hydroxide cluster growth.

Ion-by-ion growth occurs as a consequence of ionic reactions, typically when homogeneous nucleation occurs. Thus, collisions between ions will form nuclei, which are adsorbed onto the substrate. Ion-by-ion growth typically results in lager crystals, with the crystal size being directly proportional to film thickness.

Hydroxide cluster growth occurs in the presence of a metal hydroxide. Thus, the deposition mechanism can occur if $Pb(OH)_2$ is present as either a precipitate or a colloid. Hydroxide cluster growth typically results in smaller crystals relative to ion-by-ion growth. Unlike ion-by-ion growth, film thickness does not greatly influence the crystal size from hydroxide cluster growth.

This disclose describes the use of Selenourea to provide $Se^{2-}$ ions for the deposition of PbSe and the polycrystalline PbSe thin film mechanism will follow the ion-by-ion growth. Thus, PbSe will form by an ionic reaction as described by Equation 1, provided the ionic product is greater than the solubility product:

$$Pb^{2+} + Se^{2-} \rightleftarrows PbSe \quad \text{Equation 1}$$

The chemical reaction provided in Equation 1 results in precipitation of PbSe onto a substrate in solution.

Lead Selenide Deposition

Once formed, PbSe can be deposited by a variety of processing techniques, including pyrolysis, vacuum evaporation, sputtering, chemical vapor deposition (CVD), molecular-beam epitaxy (MBE), and chemical bath deposition (CBD). In accordance with disclosed examples, CBD techniques offer specific advantageous in forming PbSe nanostructures, such as being a simple, low-cost technique executable at relatively low temperatures.

The chemicals used for the preparation of PbSe thin films are of analytical grade and may be employed without specific purification. In some examples, Lead Acetate Trihydrate $((CH_3COO)Pb \cdot 3H_2O)$ and Selenourea $(CH_4N_2Se)$ are used as $Pb^{2+}$ and $Se^{2-}$ ion sources, respectively. Trisodium citrate (TSC) acts as a complexing agent for the slow release of metal ions, thus facilitating the formation of nanocrystalline PbSe thin films.

Before starting the chemical bath deposition, a Lead Acetate solution, a Selenourea solution, and/or an Iodine solution are prepared separately, which may be done some time in advance (e.g., about 24 hours in advance). For preparing the Selenourea solution, an initial amount (e.g., about 455.2 grams) of Lead Acetate Trihydrate crystals are added into a vessel (e.g., a 1000 ml plastic bottle) and add DI water slowly until the weight of the bottle reaches a threshold amount (e.g., about 800 grams). Another vessel (e.g., a 2000 ml beaker) is provided with a predetermined amount of fluid (e.g., 500 ml of DI water), which is heated (e.g., placed on a high setting on a hot plate), and the vessel with Lead Acetate is placed therein.

In some examples, at the top surface of the hotplate the reading is about 64° C. The heat supply will completely dissolve the Lead Acetate crystal within about 30 min. Upon completion of this step, the bottle of the Lead Acetate solution is kept in a constant temperature bath set to be 30° C. For preparation of Selenourea solution, 1355 gram of DI wafer is added into a 2000 ml volumetric flask, which is then placed on the hot plate. The hot plate dial to high will take about 1 hour to allow the water come to a boil. The bottom of the flask is reaching to temperature to be about 90° C. When water in the flask has been boiled for 10 minutes, the volumetric flask is put into a container with tap water for cooling until down to 70° C.

After cooling the loss amount of DI water due to boiling is added to ensure about 1355 grams are recovered. Then about 0.050 kg of the Selenourea is poured into the flask and shaking it several times until completely dissolving the Selenourea. Upon completion of making the Selenourea solution, it is placed in a dark environment at room temperature for a predetermined period of time before using for CBD.

For preparation of an Iodine solution, a pre-cleaned 250 ml graduated cylinder containing 13 grams of Potassium Iodide (KI) crystals is mixed with about 50 ml of deionized (DI) water, and add approximately 50 ml of Isopropanol into the graduated cylinder. In order to completely dissolve the crystals, the graduated cylinder is put in the ultrasonic vibrator at a power up to 100% supplied for approximately 20 minutes, and mixing thoroughly by inverting the graduated cylinder several times. If not completely dissolved, this step will be repeated 2 or 3 times. Upon completion of dissolving the KI crystals, DI water is added to the graduated cylinder until filling to 250 ml mark, and then it is mixed thoroughly by inverting the graduated cylinder 20 to 25 times. This solution is stored at room temperature at least for overnight.

Figure 4:
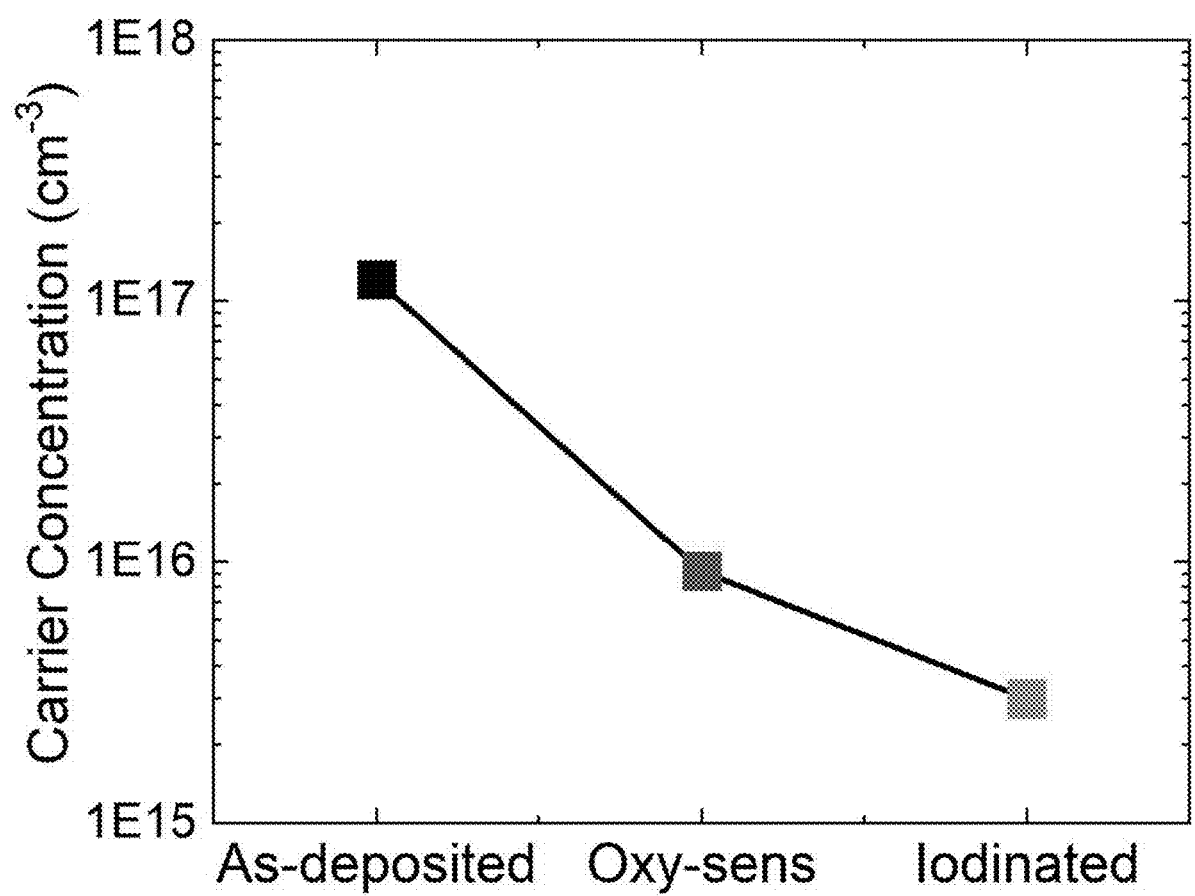
FIG. 4 is a graph providing carrier concentration levels in a PbSe nanostructure, in accordance with aspects of this disclosure.

In some examples, deposition of PbSe consists of two layers: the first layer has little or no iodine added thereto, and the second layer has been doped with an adjustable amount or concentration of iodine, which is controlled to produce desirable PbSe nanostructures (e.g., nanoprisms) with doping at amounts considered a donor impurity. Thus, the carrier concentration can be varied by adding the desirable amount of iodine during the CBD process. In examples, one or both layers are subject to a chemical bath deposition for a predetermined amount of time (e.g., 30 minutes per layer, for a total of one hour), which may be the same for reach layer, but may change. By varying the deposition time, the thin film PbSe thickness and morphology will vary, allowing for optimization of the PbSe structure and/or properties. As illustrated in the example of FIG. 4, the carrier concentration varies (e.g., lowers) as a function of the one or more sensitization treatments (e.g., oxygenation and/or iodination) applied to a PbSe nanostructure (e.g., a p-type PbSe particle).

In examples, one or more substrates are mounted in a container of DI water, which will be used to heat up the substrates by a tungsten lamp that is immerged in the DI water, and the lamp voltage is supplied by a lab-made program. The peak deposition temperature of the solution during the chemical deposition will be reached to 90° C. in a gradual manner. First amount of lead acetate solution into a 100 ml graduated beaker is measured and using a separate 250 ml graduated beaker, a second amount of Selenourea solution will be prepared separately. Depending on experimentally obtained data for single crystalline PbSe nanoprism growth, the x and y-amount will be varied and typically for PbSe detector application the x/y ratio will be 75/150. In the bottom of the solution pan, there is a Teflon coated stirring bar used with 100-300 rpm. The first amount and the second amount of each solution will be poured at the same time into the solution pan containing a stir rod and 100 ml of DI water is poured into the substrate pan as a medium which will convey heat energy from the Tungsten (W) lamp bulb to substrates which are mounted bottom of the pan facing the solution mixture. This is one way to transfer the heat energy indirectly to the substrate homogenously. The bath temperature is measured by a thermocouple, which is placed at the midpoint depth in the container. At the end of the deposition cycle, the bath temperature is centered at the peak temperature, and the pan with the substrates mounted will be abruptly detached from the container containing the solutions, and then the substrate pan is immerged into a deionized water, thus the temperature will be back to room temperature.

For the second layer deposition, the first layer will be repeated by the addition of a given amount of the iodine solution into the Selenourea and Lead Acetate solution in a container that will vary the donor concentration upon completion of chemical deposition that will be incorporated into PbSe crystal matrix. In some additional or alternative examples, the amount of added iodine for the disclosed PbSe detector may be approximately 12-60 ml (e.g., approximately 24 ml). The way of missing of the iodine addition will impact on the morphology of polycrystalline PbSe thin film as well as the distribution of the doping amount throughout the PbSe thin film. In this invention, right after adding the iodine solution 1 minute of spinning of the magnetic stirrer is given before starting actual CBD. Upon completion of the second layer, the substrate containing pan is merged in a container of the DI water until cooling down the temperature, followed by normal cleaning procedure.

The prepared PbSe thin film will be a polycrystalline structure in nature and is subject to a vacuum bake step in order to get rid of any kind of solvent, which may be captured in the thin film or the substrate, which has etched rough surface morphology. The vacuum bake step is done at a predetermined temperature (e.g., 105° C.) for a given period of time (e.g., overnight). This temperature will not alter the crystal structure of the PbSe thin film.

In some examples, (represented by block 110), during the oxidation step the initially doped iodine induces the surface recrystallization phenomena at a surface of the thin film as well as inside the PbSe matric that will form a range of the single crystalline PbSe nanoprism as well as including nanoribbons, nanorods and nanodisks. In the oxidation step, gasses are used (e.g., oxygen and/or nitrogen) and purged into a vertical oxidation quartz tube furnace from top to bottom. The gas ratio of the mixture of oxygen and nitrogen, for instance, is set to be about 20% and 75%, respectively, which may correspond to about 1.05 liter/min of oxygen flow rate and about 1.95 liter/min of nitrogen flow rate, thus about a 3.0 liter/min in total throughout the vertical furnace. The peak temperature inside the tube furnace is related to the degree of the crystallization of PbSe that can be adjusted depending on the requirement of the size and shape of the nanoparticles. Typical peak furnace temperature to obtain the rectangular shape of the nanoprism is believe to be about 420° C. (see, e.g., FIGS. 5A and 5B). As the deposited thin film PbSe alloy (having a composition ratio of Pb0.55, Se0.45) is subjected to a high temperature above the melting point of Pb (e.g., 100° C.), other phases of nanoparticles (e.g., nanoprism, nanoribbon, and/or nanodisk) may be growing by a mixed solid and liquid phase. Subsequently cooling may determine the shapes of the particles (e.g., rate of cooling, amount of time to reach desired temperature, presence of gases, etc.).

In some examples, (represented by block 112) a doping process follows, employing iodine as a donor impurity. In this block, the carrier concentration of single crystalline PbSe nanoparticles (e.g., nanoprism, nanoribbon, nanodisk) can be varied depending on a requirement of a particular applications. In other words, it is directly obtained that the impurity level in the energy band diagram can be tailored by adding the iodine in a simple tube furnace. The set temperature of the center zone of the tube furnace can be set at a predetermined point (e.g., about 347° C.) which yields an elevated exposure temperature (e.g., about 395° C.) inside the tube furnace.

In some examples iodine crystal sublimation process is performed employing a lab-made water circulated Graham tube containing iodine crystals to provide the iodine vapor into the furnace. The nitrogen gas is used as a carrier, which introduces the iodine-rich vapor into the furnace. Application of the nitrogen gas solution can be set at a predetermined rate (e.g., 1.2 standard cubic feet per hour (SCFH)) when the solution does not carry the iodine vapor, and set at a higher predetermined rate (e.g., 12.0 SCFH) when the solution does carry the vapor. By optimizing the iodine deposition time at a relatively high temperature, the doping level of the PbSe crystal can be adjusted. For examples, doping time may be set to about 70 seconds at or near peak temperatures at the center of the furnace.

Figure 2A:
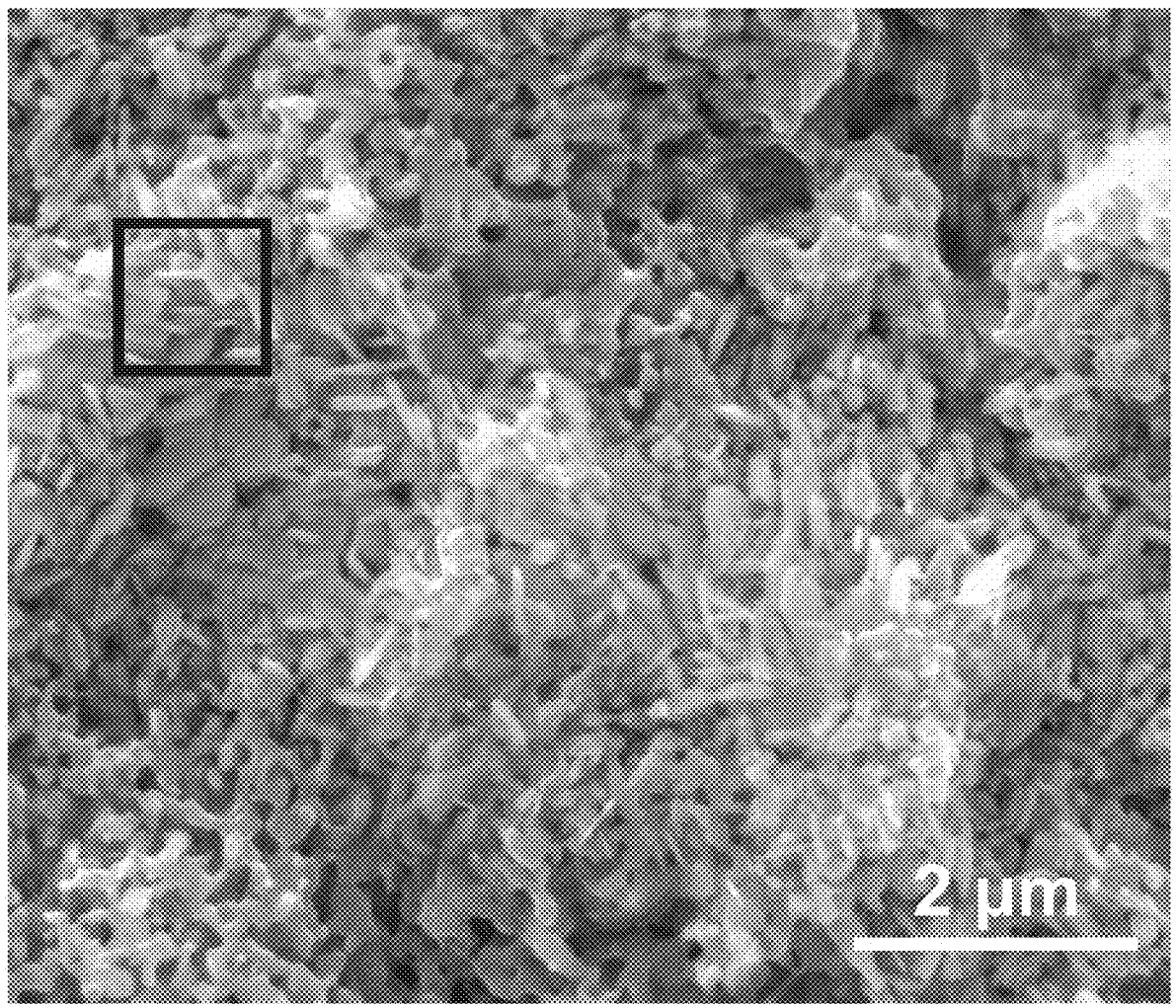
FIG. 2A is an image of PbSe nanostructures, in accordance with aspects of this disclosure.
Figure 2B:
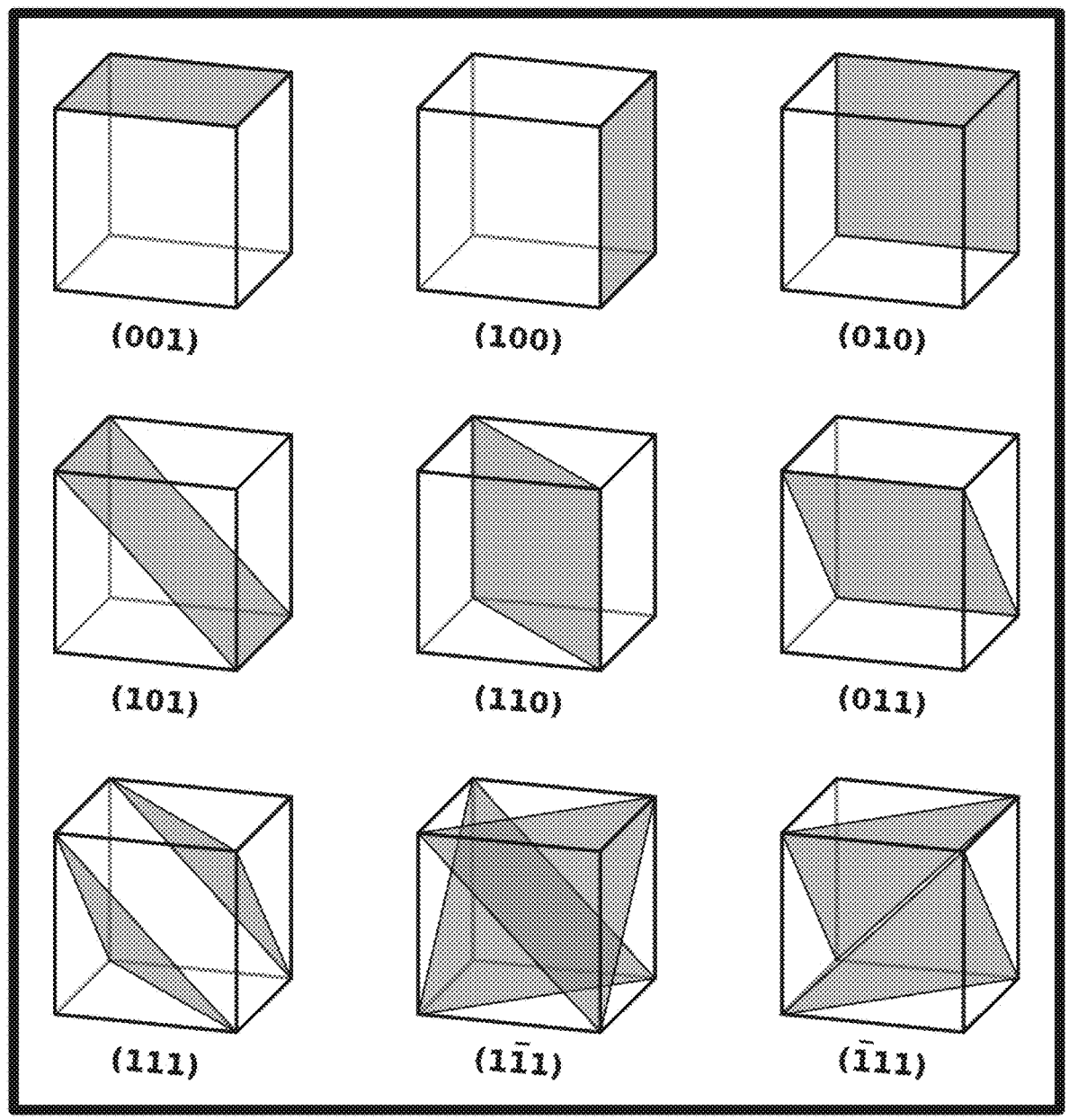
FIG. 2B shows a matrix with a number of possible nanostructure angles or crystallographic orientations for the PbSe material, in accordance with aspects of this disclosure.

In some examples, doping time can be varied to provide a desired sensitivity corresponding to a given doping concentration. As disclosed herein, the doping process is implemented as the sample (e.g., quartz substrate) is being heat treated (e.g., within a quartz furnace). FIG. 2A shows an image of a PbSe thin film (and thus nanostructures contained therein), in which the carrier concentration level can be adjusted by the two sensitization process conditions (e.g., oxygenation and/or iodination), with adjustable parameters corresponding to one or more of temperature, time, and/or amount and/or concentration of the induced gas amount during the heat treatment (e.g., within the furnace). In this disclosure, the carrier concentration in the resulting PbSe nanostructures can be modified by exponential amounts by modifying the parameter of one or more of the two sensitization processes. FIG. 2B shows a number of possible nanostructure angles or crystallographic growth orientations for the PbSe material.

In some examples, (represented by block 114), annealing is performed to reduce the temperature of the nanoparticles following iodination.

Fabrication of PbSe Nanoparticles

As this stage, the nanoparticles are not detectable to investigation (e.g., under SEM or other investigation tools), as the single crystalline nanoparticles are not exposed, as they are embedded in and/or underlying the polycrystalline PbSe thin film.

Figure 3A:
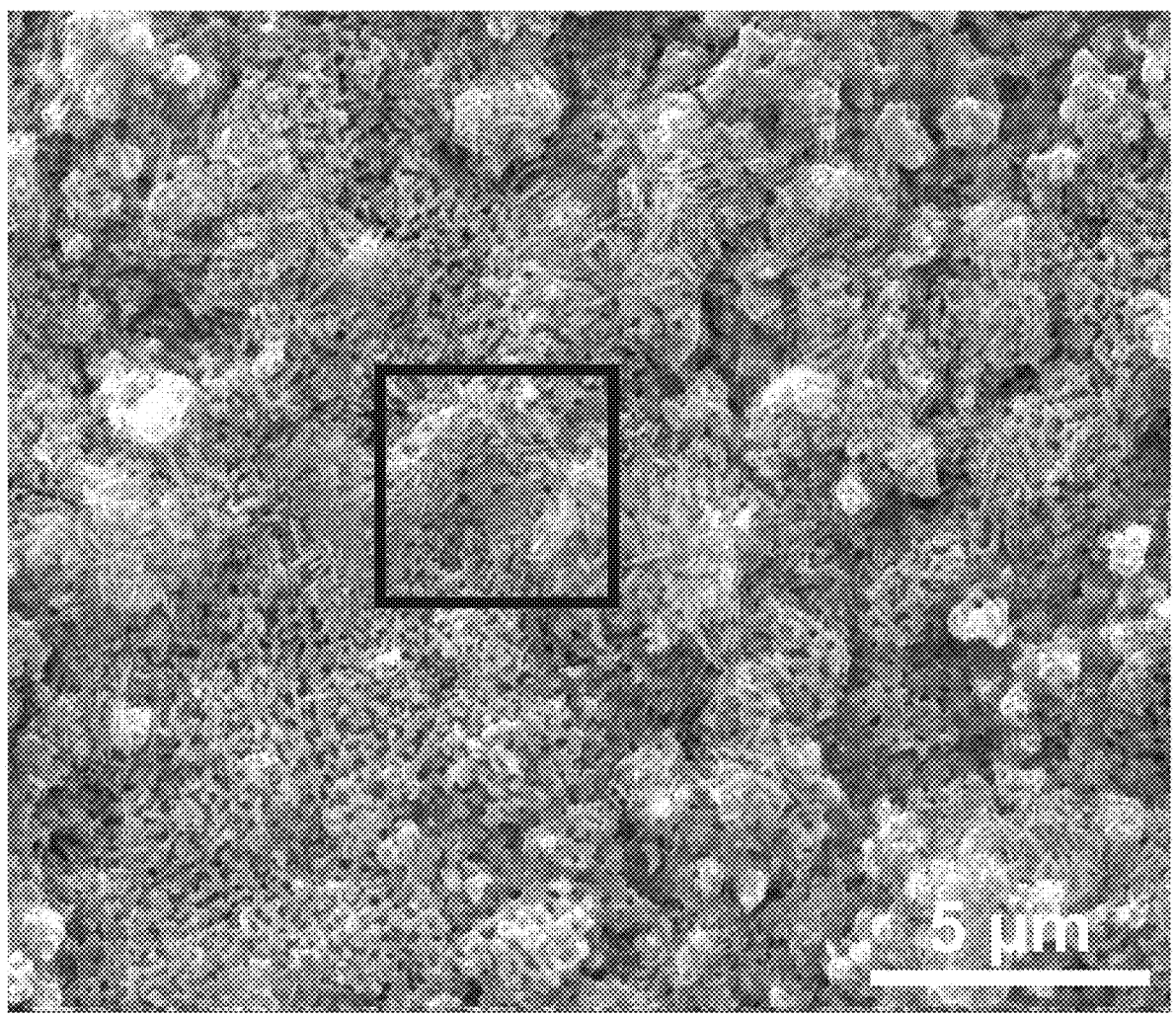
FIG. 3A is an image of PbSe nanostructures produced by disclosed methods, in accordance with aspects of this disclosure.
Figure 3B:
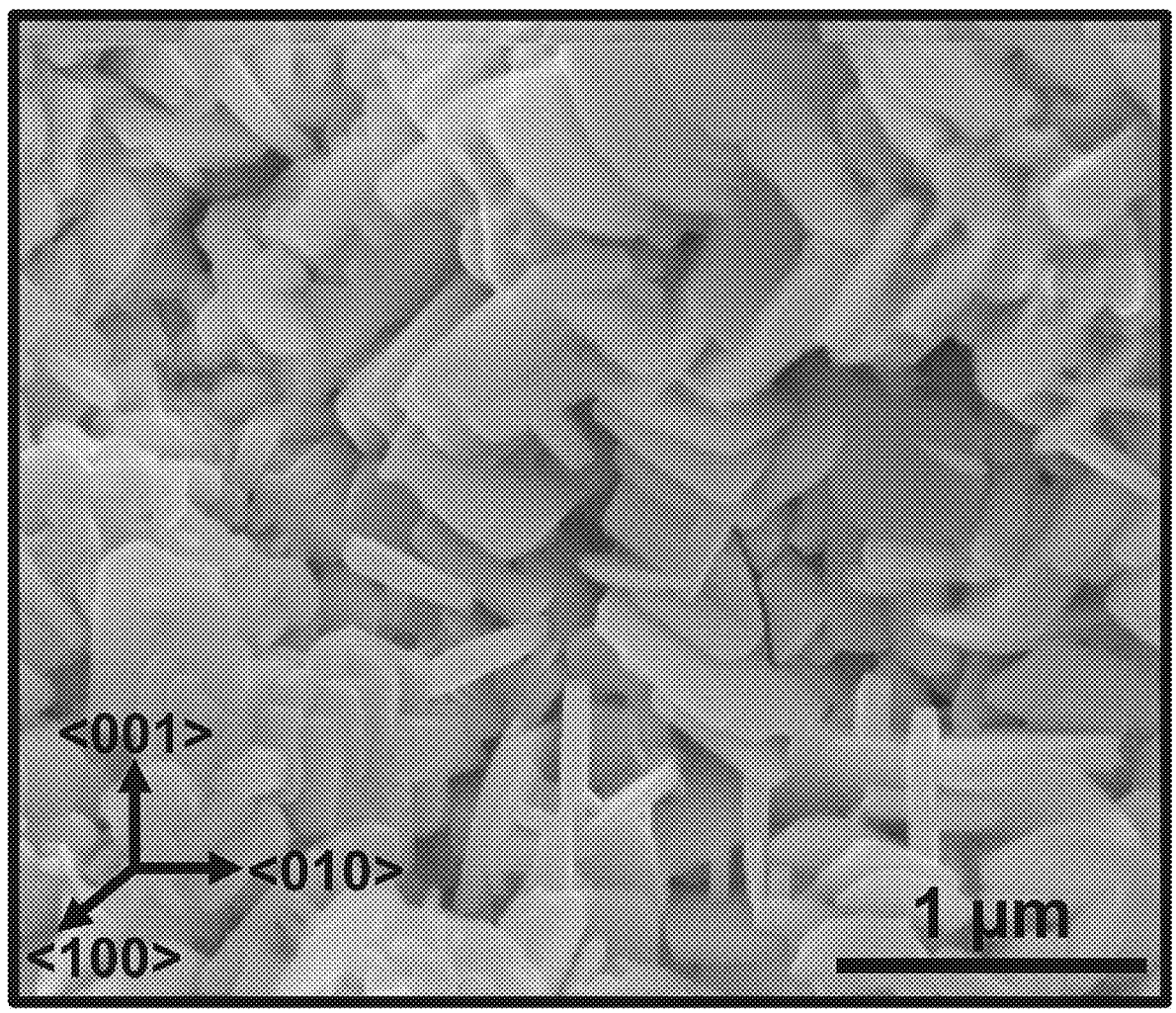
FIG. 3B is a detailed image of the PbSe nanostructures of FIG. 3A, in accordance with aspects of this disclosure.

In disclosed examples, (represented by block 116) the PbSe nanoparticles can be exposed through a surface etching process using etchants, such as a diluted hydrogen fluoride (HF) solution diluted HF solution (DI water:HF=50:1 in volume ratio) or a solution of NaOH:IPA:Di water (1:25:50 in volume ratio). Example nanoparticles obtained via disclosed methods are shown in FIG. 3A. FIG. 3B illustrates PbSe nanoprisms within the image of a PbSe nanostructure in FIG. 3A, taking the shape of grans with angular profiles 101 and 110, as provided in the matrix.

As confirmed under SEM investigation, in the case of rectangular shape nanoprisms, a first dimension (e.g., length) is estimated to range from 400 nm to near 1 micron, and a second dimension (e.g., thickness) is estimated to range from a few nm to 50 nm. Under energy-dispersive X-ray spectroscopy (EDS) analysis, PbSe nanocrystals/nanostructures containing iodine as a dopant are presented. For instance, FIG. 3B displays a high number of nanoparticles with a size of 1 micron×1 micron. These particles can be collected in a solution based method.

In some examples, (represented by block 118), post processing, such as a long term post bake, is performed at a predetermined temperature (e.g., about 150° C.) that will provide one or more of the following benefits: the doped iodine will be evenly re-distributed into the PbSe nanoparticles, which may grow in size during the post-baking step.

The disclosed methods are designed to synthesize substantially flat PbSe nanostructures (e.g., nanoprism, nanoplates) using a CBD technique and iodine doping process, and ultimately control electrical properties of PbSe nanostructures as shown in the example graph of FIG. 4.

The substantial number of single crystalline PbSe nanoprisms throughout the PbSe matrix increases the sensitivity and detection performance of the thin film leading to technical benefits beyond detection, in other applications including, for example, solar cells, light emitting diodes, gas analysis, medical services, industrial processes, emissions monitoring, spectroscopy, process control systems, thermal imaging, defense and security technologies and/or nano-size detector in mid-wave IR regions (e.g., 3-5 microns).

Although the instant disclosure references applications for PbSe, such as thin film photodetectors employing PbSe, the disclosed methods may be applicable to other Pb-based chalcogenide and/or semiconducting materials, and/or other metal alloys (e.g., including other post-transition metals).

Figure 5A:
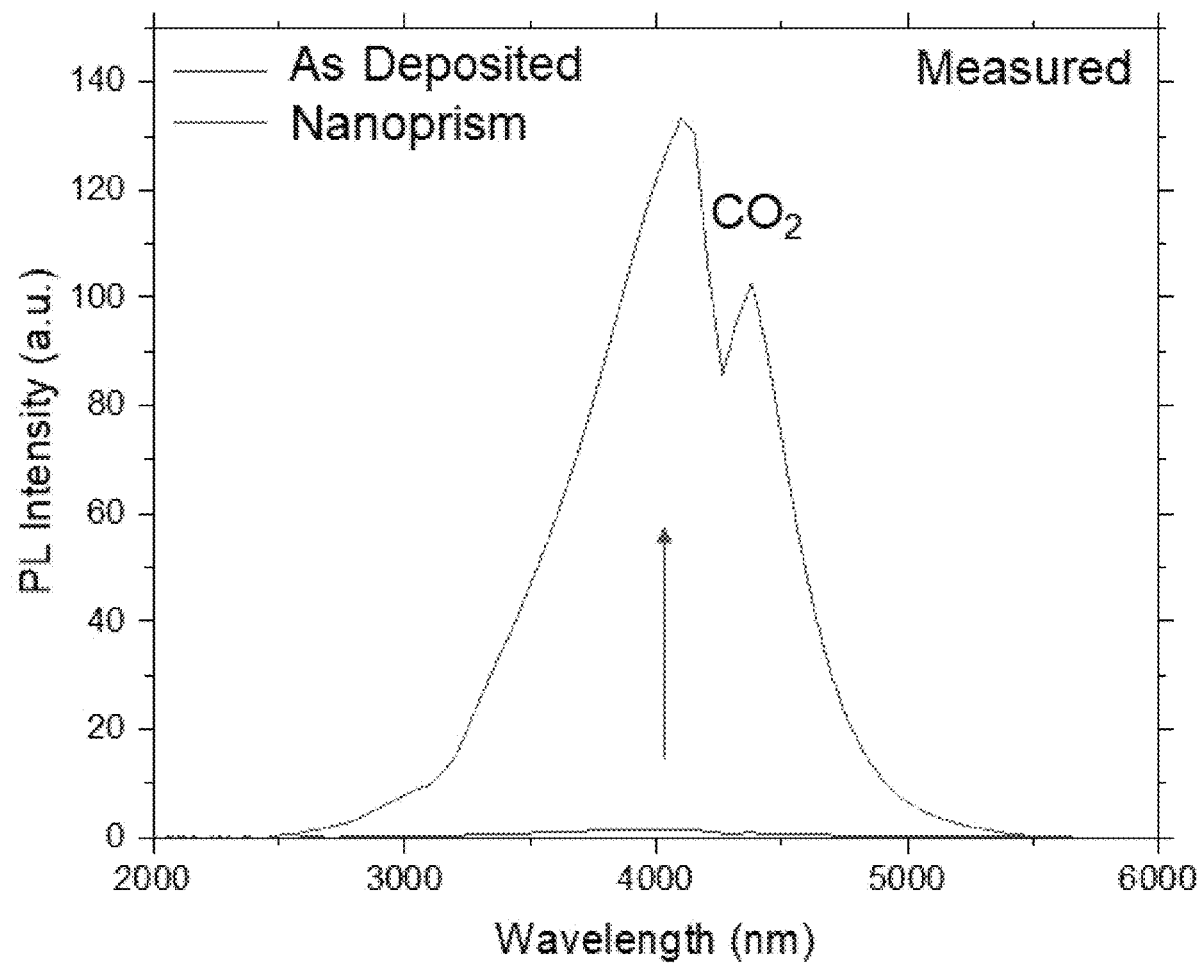
FIGS. 5A and 5B are graphs providing photo-luminescent measurement levels for PbSe nanostructure, in accordance with aspects of this disclosure.
Figure 5B:
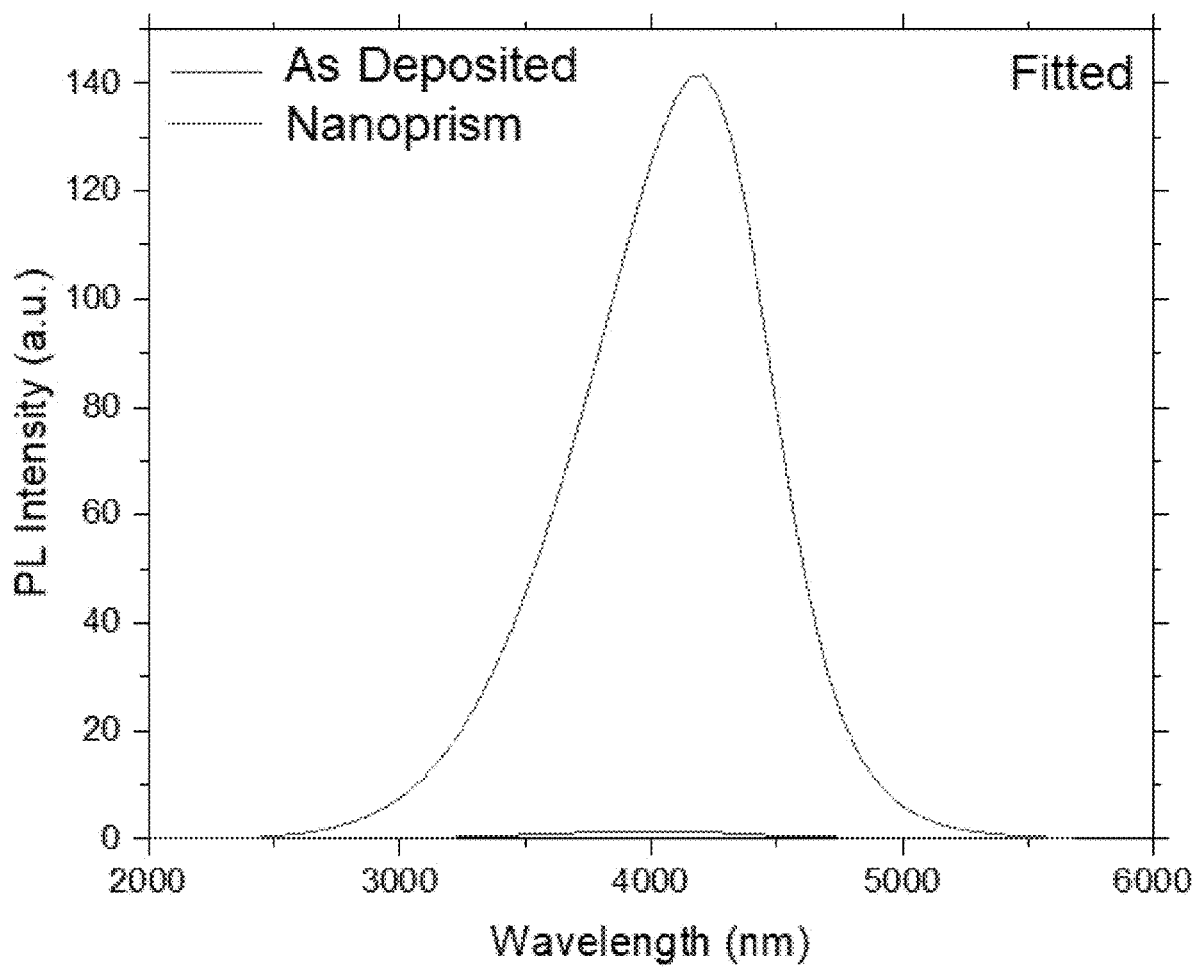

FIGS. 5A and 5B are graphs providing photo-luminescent measurement levels for PbSe nanostructure, in accordance with aspects of this disclosure. For example, Photoluminescence (PL) can be measured via a process to test the electronic structure of a particular material. PL is a phenomenon when electromagnetic energy is absorbed and then emitted at a range of wavelengths, which may be of a different wavelength from the absorbed electromagnetic energy.

In some examples, a monochromatic source of energy (e.g., a laser) is directed to the material to excite the sample. Electrons excited in response to this energy move from the ground state to a higher, excited energy state. The material then emits energy as a combination of phonons (vibrations) and photons (light) as it returns to the ground state. A sensor can measure the emitted light for spectral and/or spatial analysis to yield information about material properties.

In some examples, the excited states are in the conduction-band (CB). The excitation photon should be shown exciting the electron high into the CB. Then non-radiative relaxation brings the electron to the conduction-band minimum (CBM).

The emitted energy is less than the absorbed energy, as an amount of energy is consumed during interaction with the material. The energy of the emitted light due to radiative recombination is related to the difference between the two energy levels involved in the transition between an excited state and an equilibrium state.

This process can be used to generate information in a variety of situations, such as defect detection, measure impurity levels, recombination mechanisms, analyze material quality, band gap energy determinations, molecular structure and crystallinity, as a list of non-limiting examples.

FIG. 5A shows an example of the PL intensity for both an unprepared material juxtaposed against a nanoprism material prepared by disclosed methods. The unprepared material reached a low level (e.g., less than 10 a.u.), whereas the disclosed nanoprism material reached a peak nearing 140 a.u. Thus, the PL intensity has been increased approximately 140 times better than deposited, unprepared material, indicating that the degree of the PbSe crystallinity is substantially enhanced. FIG. 5B shows a filtered or smoothed line of the PL graph of FIG. 5A.

Although several examples and/or embodiments are described with respect to PbSe nanostructures, the principles and/or advantages disclosed herein can employ technologies that are not limited to a particular type of material and/or application.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method of forming a single crystalline lead selenide (PbSe) nanostructure, comprising:
   preparing a substrate;
   preparing chemical lead and selenium precursors;
   depositing the precursors to the substrate via a chemical bath deposition (CBD) process, resulting in a thin film comprising a PbSe alloy;
   vacuum baking the thin film at a temperature above 100° C. to get rid of residual solvent;
   exposing the thin film to an oxygenated gas to induce re-crystallization and produce an oxide passivation layer;

doping the thin film with a vapor comprising a predetermined concentration of iodine for a predetermined time period;

applying nanostructure isolation techniques using a chemical etchant or an electrochemical etching process to the thin film to uncover a single crystalline PbSe nanostructure underlying the oxide passivation layer and polycrystalline PbSe; and post processing the thin film with the uncovered single crystalline PbSe to redistribute iodine to the PbSe nanostructure.

2. The method of claim 1, wherein the depositing yields two layers PbSe crystalline layer, comprising:

a first, exposed layer comprising a polycrystalline PbSe oxide form substantially free of iodine; and a second, underlying layer comprising the single crystalline PbSe nanostructures comprising iodine, wherein an amount of iodine in the single crystalline PbSe is controlled by one or more of a time or a temperature during the doping.

3. The method of claim 2, wherein the depositing comprises:

depositing the precursors for a first time to create the first layer during the CBD process; and depositing the precursors and a carrier solution having a predetermined amount of iodine for a second time to create the second layer during the CBD process.

4. The method of claim 3, further comprising varying a time for the deposition during the first or second time, the change in time corresponding to a change in a thickness or morphology of the single crystalline PbSe thin film.

5. The method of claim 1, further comprising annealing prior to the applying nanostructure isolation techniques.

6. The method of claim 1, wherein the first time or the second time is about 30 minutes.

7. The method of claim 1, wherein the first time or the second time can be varied depending on specification required.

8. The method of claim 1, wherein the oxygenated gas comprises a mixture of oxygen and nitrogen.

9. The method of claim 1, further comprising adjusting the threshold temperature to control of the crystallization of PbSe nanostructure, the threshold temperature corresponds to a size or a shape of the PbSe nanostructure.

10. The method of claim 1, wherein the PbSe nanostructure comprises one or more of a PbSe nanoprism, a PbSe nanoplate, a PbSe nanoribbon, or a PbSe nanodisk.

11. The method of claim 1, wherein the PbSe nanostructure are formed underneath the oxide layer in a variety of different sizes that can be controlled upon fabrication parameters.

12. The method of claim 1, wherein the predetermined temperature corresponds to about 420° C., resulting in a generally rectangular shape of the nanostructures.

13. The method of claim 1, wherein substrate comprises a quartz substrate with one or more rough surfaces.

14. The method of claim 1, wherein the doping with iodine further comprises introducing an iodine vapor into the furnace using nitrogen gas as a carrier.

15. The method of claim 1, further comprising post processing by adjusting one of a temperature or a time of the post processing to control a size of the PbSe nanostructures and re-distribution of iodine concentration.

16. The method of claim 1, further comprising controlling a rate, time, or temperature of a cooling process to control the shape of the PbSe nanostructures.

17. The method of claim 1, further comprising one or more additional annealing procedures including at a predetermined time or temperature to evenly or homogeneously distribute the dopants throughout PbSe matrix.

18. The method of claim 1, wherein the etching of the polycrystalline PbSe material employs a hydrogen fluoride (HF) solution or NaOH:IPA:DI water.

19. The method of claim 1, wherein the polycrystalline crystal growth can occur by one of two general deposition mechanisms: ion-by-ion growth, or hydroxide cluster growth.

* * * * *